(12) United States Patent
Hung et al.

(10) Patent No.: US 9,048,256 B2
(45) Date of Patent: Jun. 2, 2015

(54) GATE INSULATOR UNIFORMITY

(71) Applicant: APPLE INC., Cupertino, CA (US)

(72) Inventors: Ming-Chin Hung, Cupertino, CA (US); Young Bae Park, San Jose, CA (US); Chun-Yao Huang, Cupertino, CA (US); Shih Chang Chang, Cupertino, CA (US); John Z. Zhong, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 112 days.

(21) Appl. No.: 13/679,767

(22) Filed: Nov. 16, 2012

(65) Prior Publication Data

US 2014/0141565 A1   May 22, 2014

(51) Int. Cl.
*H01L 21/00* (2006.01)
*H01L 29/66* (2006.01)
*H01L 29/786* (2006.01)
*H01L 27/12* (2006.01)

(52) U.S. Cl.
CPC ...... *H01L 29/66742* (2013.01); *H01L 29/7869* (2013.01); *H01L 27/1225* (2013.01); *H01L 29/66969* (2013.01)

(58) Field of Classification Search
None
See application file for complete search history.

(56) References Cited

U.S. PATENT DOCUMENTS

| | | | |
|---|---|---|---|
| 5,483,082 A * | 1/1996 | Takizawa et al. | 257/59 |
| 5,580,796 A * | 12/1996 | Takizawa et al. | 438/158 |
| 6,567,150 B1 * | 5/2003 | Kim | 349/187 |
| 7,671,367 B2 * | 3/2010 | Ahn | 257/59 |
| 7,751,021 B2 * | 7/2010 | Ahn et al. | 349/187 |
| 7,972,880 B2 * | 7/2011 | Oh et al. | 438/30 |
| 8,435,814 B2 * | 5/2013 | Oh et al. | 438/30 |
| 2005/0092990 A1 * | 5/2005 | Yoo et al. | 257/59 |
| 2006/0125993 A1 * | 6/2006 | Hoshino et al. | 349/149 |
| 2007/0002249 A1 * | 1/2007 | Yoo et al. | 349/141 |
| 2010/0003775 A1 * | 1/2010 | Kwon | 438/30 |
| 2010/0271564 A1 * | 10/2010 | Nakata | 349/46 |
| 2011/0168252 A1 | 7/2011 | Krasnov et al. | |
| 2012/0139045 A1 * | 6/2012 | Kim | 257/347 |
| 2012/0168750 A1 * | 7/2012 | Hayashi et al. | 257/43 |
| 2012/0199891 A1 * | 8/2012 | Suzuki et al. | 257/288 |
| 2012/0267635 A1 * | 10/2012 | Moon et al. | 257/72 |

FOREIGN PATENT DOCUMENTS

| | | |
|---|---|---|
| JP | 2011216585 A | 10/2011 |
| JP | 2011258804 A | 12/2011 |

\* cited by examiner

*Primary Examiner* — Charles Garber
*Assistant Examiner* — Evren Seven
(74) *Attorney, Agent, or Firm* — Fletcher Yoder PC

(57) ABSTRACT

Embodiments of the present disclosure relate to display devices and methods for manufacturing display devices. Specifically, embodiments of the present disclosure employ an enhanced etching process to create uniformity in the gate insulator of thin-film-transistor (TFTs) by using an active layer to protect the gate insulator from inadvertent etching while patterning an etch stop layer.

12 Claims, 16 Drawing Sheets

GATE INSULATOR UNIFORMITY

BACKGROUND

The present disclosure relates generally to electronic device displays, and, more particularly, to reducing non-uniformity in the gate insulator of an oxide thin-film-transistor (TFT).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

During the fabrication of electronic device displays, numerous masks may be used to define areas of deposition and/or etching to create patterned materials on the TFT backplanes. For example, materials may be dry-etched using a plasma etching machine on an area that is masked. Further wet-etching may pattern masked areas by use of certain chemicals, such as oxalic acid. Unfortunately, during the etching process, certain portions of the TFT may be inadvertently etched away. For example, the surface of a gate insulation layer may be etched away. The gate insulation layer may insulate the gate lines from outer layer of the TFT. Non-uniformity in the gate insulation layer may cause mura effects, especially when displaying low grey scale images.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the present disclosure relate to devices and methods for reducing non-uniformity in the gate insulator of an oxide thin-film-transistor (TFT). In some embodiments, to protect the GI layer during etching, Indium Gallium Zinc Oxide (IGZO) may be used as an etching stop layer, such that uniformity of the gate insulator may be maintained. Accordingly, uniformity in the GI layer may be maintained.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The embodiments described herein relate to patterning layers of a thin-film-transistor (TFT). To pattern various layers of a TFT, a photo resist layer (PRL) may be applied to the display panel TFT backplane. The photoresist layer may include a light-sensitive material, such as a polymeric coating, designed to change properties upon exposure to light. Accordingly, when a photomask is aligned with the photoresist layer to only allow irradiation of a portion of the photoresist layer, development of portions of the photoresist layer may occur. For example, in certain embodiments, a positive development polymer may be used to develop the photoresist layer. In such embodiments, the polymer may be more soluble after exposure to light. Accordingly, as light irradiates portions of the photoresist layer, those portions may be removed (e.g., by using an appropriate developer fluid), creating a pattern in the photoresist layer. In alternative embodiments, a negative development polymer may be used. In such embodiments, the polymer may be less soluble after irradiation by light. Accordingly, as light irradiates portions of the photoresist layer, the portions of the photoresist layer that are not irradiated may be removed (e.g., by using an appropriate developer fluid).

In either case, the photomask may be used to create a pattern in the photoresist layer that is useful for defining patterning areas for multiple layers of a display panel TFT backplane. The embodiments described herein are not intended to limit manufacturing to positive or negative photoresist processes. Further, although particular patterning mechanisms (e.g., dry-etching via a photo-resist layer) are detailed herein, these mechanisms are not intended to limit the embodiments, but instead are provided as an example.

Figure 1:
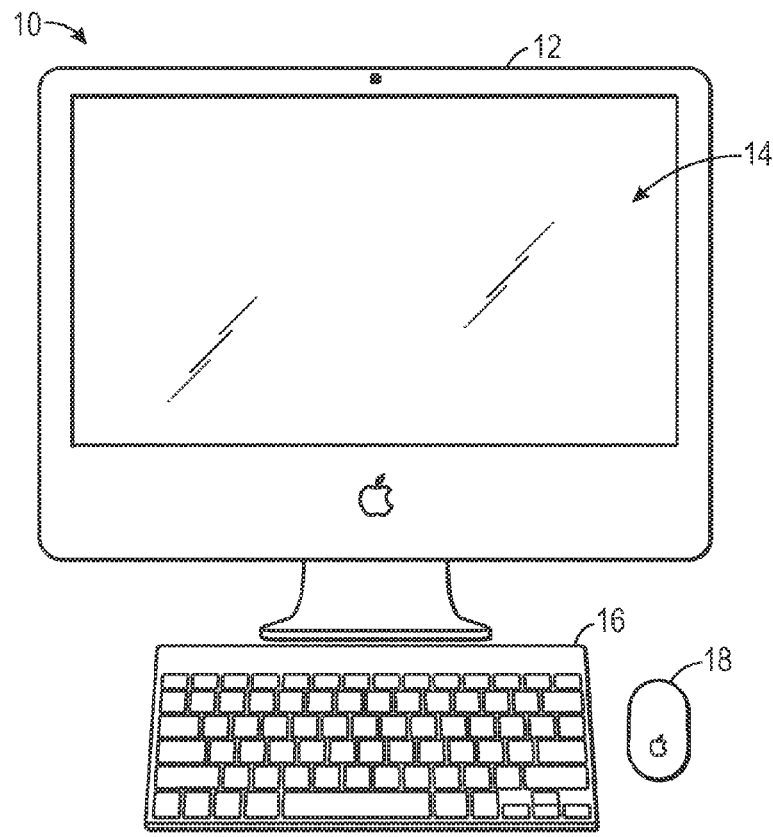
FIG. 1 is a schematic block diagram of an electronic device with a display manufactured using the enhanced etching process described herein, in accordance with an embodiment.

FIG. 1 illustrates an electronic device 10 that may be manufactured using the techniques described herein. It should be noted that while the techniques will be described below in reference to illustrated electronic device 10 (which may be a desktop computer), the techniques described herein are usable with any electronic device employing a display. For example, other electronic devices may include a laptop computer, a tablet computer, a viewable media player, a mobile phone, a personal data organizer, a workstation, a standalone display, or the like. In certain embodiments, the electronic device may include a model of an iMac®, Mac® mini, Mac Pro®, MacBook®, a MacBook® Pro, MacBook Air®, Apple Cinema Display®, Apple Thunderbolt Display®, iPad®, iPod® or iPhone® available from available from Apple Inc. of Cupertino, Calif. In other embodiments, the electronic device may include other models and/or types of electronic devices or standalone displays, available from any manufacturer.

As illustrated in FIG. 1, electronic device 10 includes a housing 12 that supports and protects interior components, such as processors, circuitry, and controllers, among others, that may be used to generate images to display on display 14. Electronic device 10 also includes user input structures 16 and 18, shown here as a keyboard and a mouse, that may be manipulated by a user to interact with electronic device 10. For example, user input structures 16 and 18 may be employed to operate a graphical user interface (GUI) and applications running on electronic device 10. Input structures 16 and 18 may be connected to the electronic device 10 through a wired or wireless configuration. Further, in certain embodiments, electronic device 10 may include other types of user input structures, such as a touchscreen or trackpad, among others.

As described above, the display 14 may be manufactured using an enhanced etching processes described herein. The enhanced etching processes may reduce etching of a gate insulator (GI) for the display 14 by creating an effective etching stop for the etching process over the GI. Accordingly, the display 14 may be manufactured with a more uniform GI, resulting in fewer resultant image irregularities, especially when displaying low grey scale images.

Having discussed applications for the enhanced etching process, the discussion now turns to a more detailed discussion of embodiments that provide uniformity in the GI, starting first with a process for manufacturing a uniform GI using an active material as an etching mask.

Figure 2:
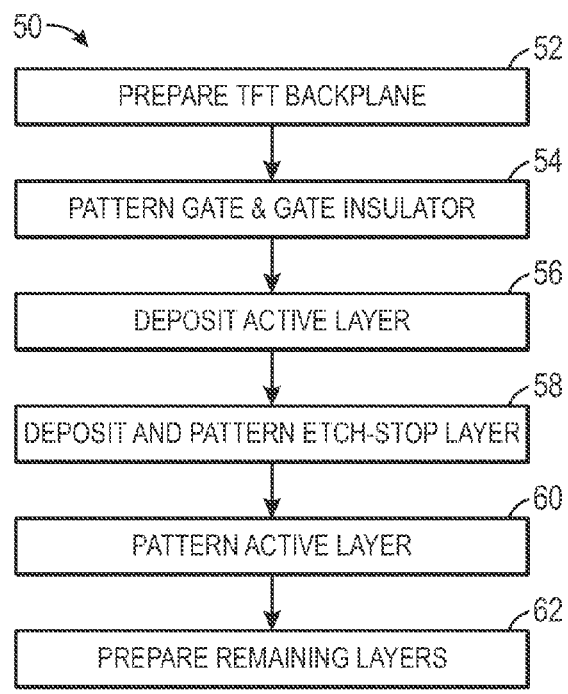
FIG. 2 is a flowchart describing a process for manufacturing a uniform gate insulator, in accordance with an embodiment.

FIG. 2 illustrates a process 50 for applying and patterning layers of the TFT, such that the gate insulator is protected from inadvertent etching. The process 50 begins by preparing the display panel TFT backplane (block 52) by preparing a substrate for the deposition of material that will form the TFT.

After the display panel TFT backplane is prepared, a gate layer and gate insulator may be formed (block 54) on the substrate. For example, a gate metal may be deposited to form gate lines. The gate lines provide scanning signals from driving circuitry of the display panel TFT backplane to gates of thin-film-transistors connected to the respective gate lines. Further, a gate insulator may be disposed over the gate lines. The gate insulator may insulate the gate lines from the outer layers of the display panel TFT backplane. In some embodiments, may consist of a silicon nitride (g-SiNX) or silicon dioxide (SiO2). As previously discussed, when the gate insulator is non-uniform, mura effects and other inconsistent image aberrations may occur. Accordingly, to increase image output quality, the gate insulator may be shielded from inadvertent etching caused by the etching of other layers of the TFT.

For example, an active layer that is to be deposited in the TFT may act as an etch stop around all or portions of the gate insulator. The active layer may be deposited over the gate insulator (block 56) and may act as an electricity transfer mechanism between a source/drain coupled to the active layer. Before patterning the active layer, an etch stop layer may be deposited and patterned (block 58). The etch stop layer may prevent over etching of layers of the TFT. Because the active layer is deposited between the etch stop layer and the gate insulator, the active layer may protect the gate insulator from inadvertent etching caused by patterning (e.g., dry etching) the etch stop layer.

Once patterning of the etch stop layer is complete, the active layer may be patterned (block 60). Additionally, the remaining layers/components of the TFT may be deposited (block 62). For example, as will be discussed in more detail below, a source, drain, organic passivation layer, common electrode (VCOM), a second passivation layer, and a pixel electrode layer may be deposited and patterned. The source may be coupled to data lines that may be used to transmit image data from a source driver of the display panel TFT backplane to pixels of the display panel TFT backplane corresponding to the data lines. A source/drain passivation layer may be disposed over the source/drain and may insulate the source/drain from outer layers of the display panel TFT backplane. In some embodiments, the source/drain passivation layer may consist of a silicon oxide or silicon nitride. The organic passivation layer 116 may provide electrical stability by isolating various elements of the display panel TFT backplane and, in some embodiments, may consist of an acrylic material, a cyclic olefin polymer, or spin-on-glass (SOG). The VCOM layer may provide a shared common voltage to the display panel TFT backplane.

FIGS. 3A-3E and 4A-4D illustrate embodiments of TFTs created through the process 50. The figures depicts the progression of the TFT over time as the TFT is patterned. For simplicity, multiple manufacturing processes may be described and/or shown in each figure. Because the formation of the TFTs conform to the process 50 of FIG. 2, the uniformity of the gate insulator may be maintained. The embodiment of FIG. 3 uses eight masks to create the TFT, while the embodiment depicted in FIG. 4 uses seven masks to create the TFT.

Figure 3A:
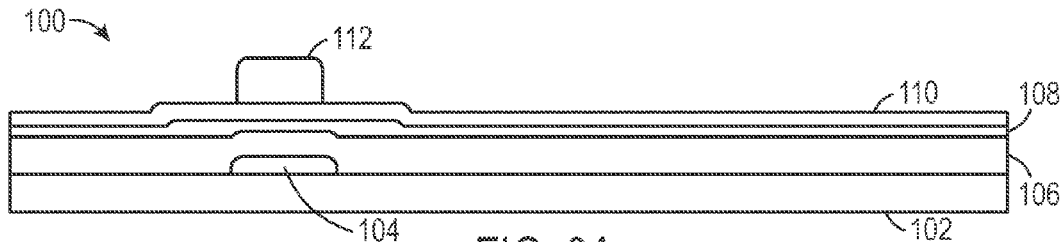
FIGS. 3A-3E illustrate a progression of manufacturing a TFT using eight masks, in accordance with an embodiment.

In the embodied TFT 100 of FIG. 3A, the substrate 102 is prepared for deposition of material. Further, the gates 104 are deposited and patterned (e.g., via a photolithographic process using a first mask) and a gate insulator 106 is deposited over the gates 104 (according to block 54 of FIG. 2). An active layer 108 is deposited over the gate insulator 106. Further, an etch stop layer 110 is deposited and patterned (e.g., via a photolithographic process using a photo-resist layer (PRL) 112 created by a PRL 112 defined by a second mask). The etch stop layer 110 may be dry etched leaving only a portion defined by the PRL 112. During the dry etching of the etch stop layer 110, the active layer 108 may act as an additional barrier between the etching and gate insulator 106. Accordingly, the entire gate insulator 108 may be retained without inadvertent etching caused by the dry etching of the etch stop layer 110.

Figure 3B:
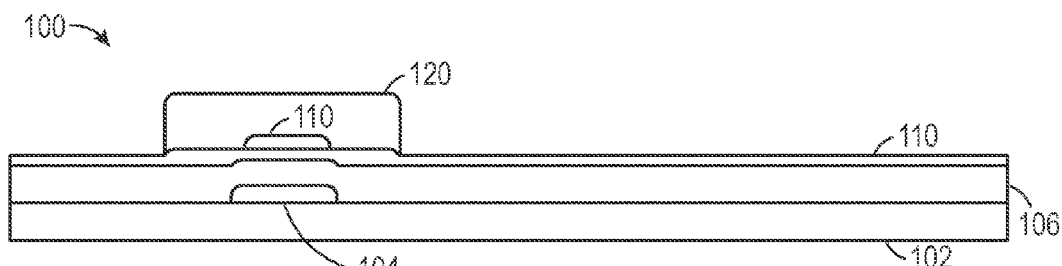

As illustrated in FIG. 3B, the portion of the etch stop layer not defined by PRL 112 has been etched away, while the active layer 108 and entire gate insulator 106 remain. At this point, a PRL 120 defined by a third mask may be used to pattern the active layer 108. For example, as illustrated the PRL 120 may be used in a photolithographic process to retain a portion of the active layer above the gate 104.

Figure 3C:
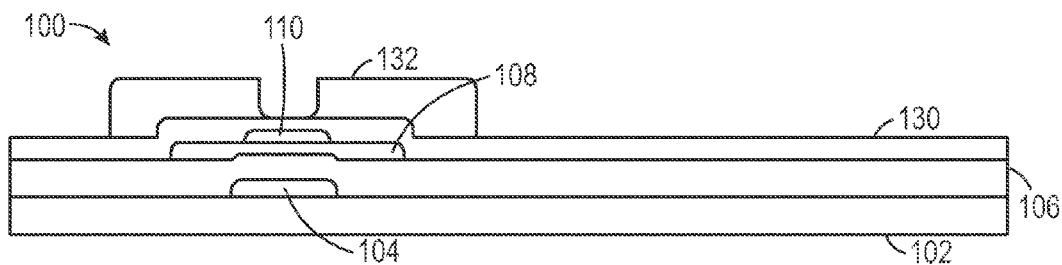
Figure 3D:
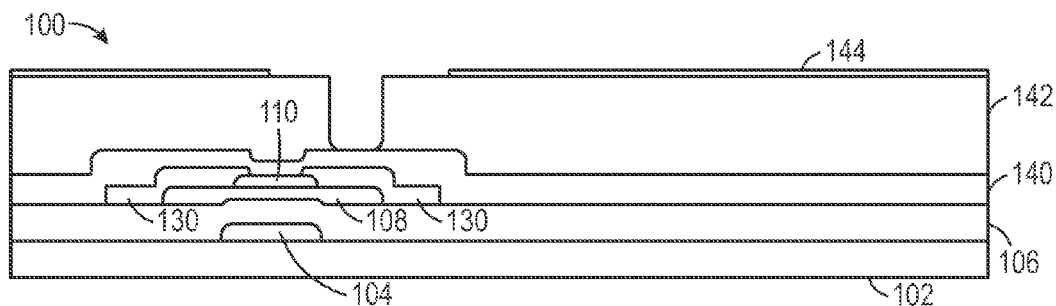
Figure 3E:
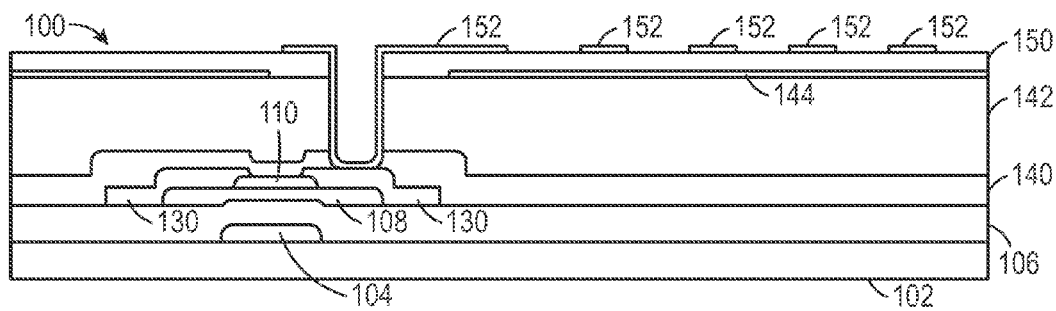

FIG. 3C illustrates that only the portion of the active layer 108 defined by the PRL 120 has been retained. Further, a source and drain layer 130 is deposited, which may be patterned (e.g., via a photolithographic process using a PRL 132 defined by a forth mask). Accordingly, as illustrated in FIG. 3D, only the portion of the source and drain layer 130 defined by the PRL 132 is retained. Further, a source and drain passivation layer 140 is deposited and an organic passivation layer 142 is deposited and patterned using a fifth mask. Additionally, a common electrode (VCOM) layer 144 is deposited and patterned using a sixth mask. In FIG. 3E, a second passivation layer 150 is deposited and patterned over the VCOM layer 144 using a seventh mask. Additionally, a pixel electrode layer 152 is formed over the second passivation layer 150 using an eighth, completing the TFT 100.

Figure 4A:
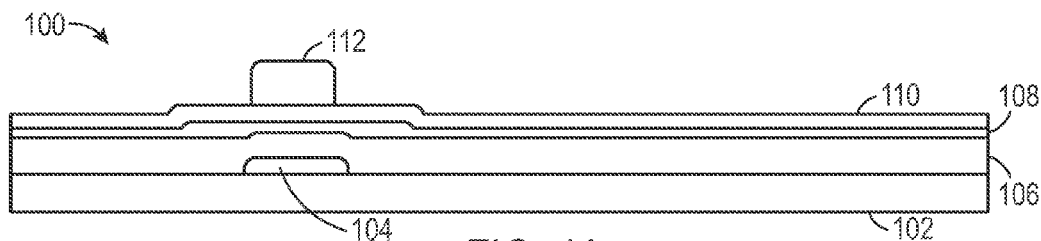
FIGS. 4A-4D illustrate a progression of manufacturing a TFT using seven masks, in accordance with an embodiment.

In some embodiments, the TFT 100 may be manufactured using seven masks. One such embodiment is depicted in FIG. 4. As illustrated in FIG. 4A and similar to FIG. 3A, the substrate 102 is prepared for deposition of material. Further, the gates 104 are deposited and patterned (e.g., via a photolithographic process using a first mask) and a gate insulator 106 is deposited over the gates 104 (according to block 54 of FIG. 2). An active layer 108 is deposited over the gate insulator 106. Further, an etch stop layer 110 is deposited and patterned (e.g., via a photolithographic process using a PRL 112 defined by a second mask). The etch stop layer 110 may be dry etched leaving only a portion defined by the PRL 112. During the dry etching of the etch stop layer 110, the active layer 108 may act as an additional barrier between the etching and gate insulator 106. Accordingly, the entire gate insulator 106 may be retained without inadvertent etching caused by the dry etching of the etch stop layer 110.

Figure 4B:
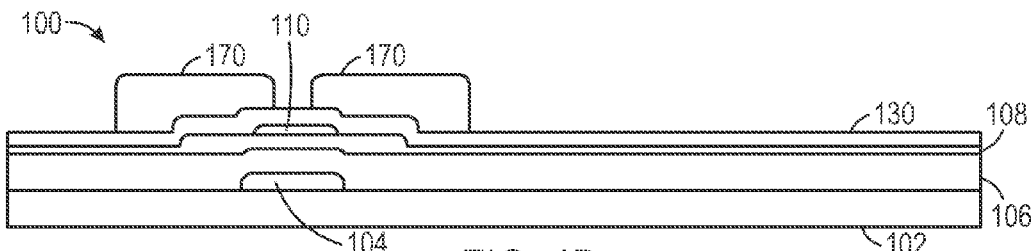
Figure 4C:
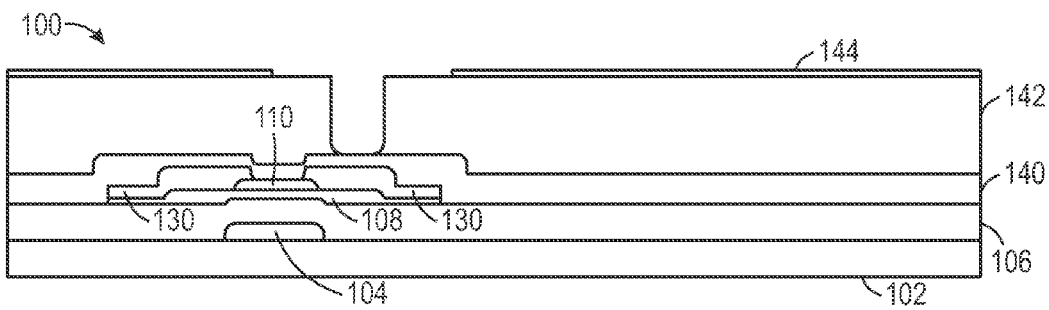
Figure 4D:
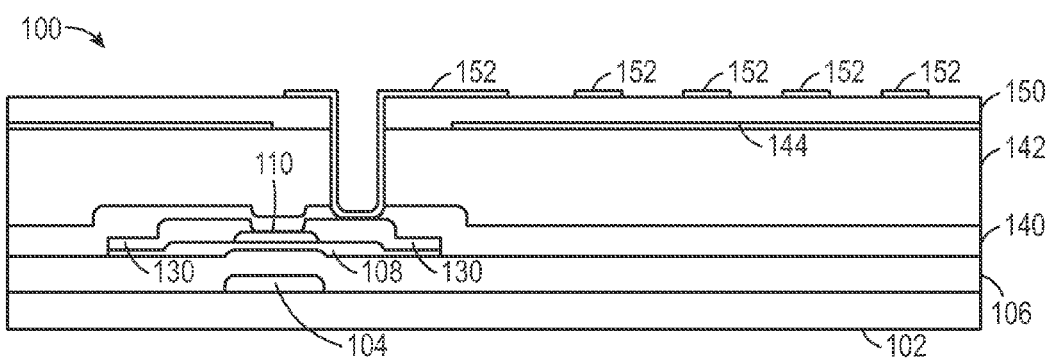

In FIG. 4B, only the portion of the etch stop layer 110 defined by the PRL 112 is retained. Further, a source and drain layer 130 and an active layer 108 may be deposited and patterned the etch stop layer a third mask 170. Accordingly, as illustrated in FIG. 4C, only the portion of the source and drain layer 130 and the active layer 108 defined by the mask 170 is retained. Further, a source and drain passivation layer 140 is deposited and an organic passivation layer 142 is deposited and patterned using a fourth mask. Additionally, a common electrode (VCOM) layer 144 is deposited and patterned using a fifth mask. In FIG. 4D, a second passivation layer 150 is deposited and patterned over the VCOM layer 144 using a sixth mask. Additionally, a pixel electrode layer 152 is formed over the second passivation layer 150 using a seventh mask, completing the TFT 100.

Figure 5:
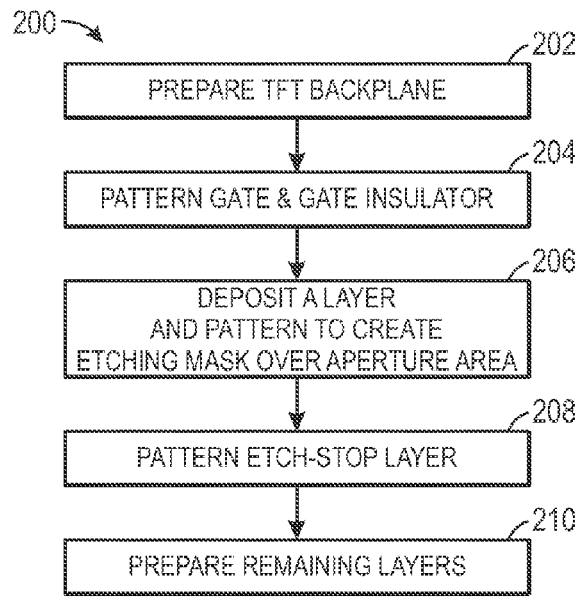
FIG. 5 is a flowchart describing a process for manufacturing a uniform gate insulator using an etching mask, in accordance with an embodiment.

In some embodiments, an etching mask may be formed by patterning the active layer of the TFT. The etching mask may be useful to protect portions of the gate insulator. FIG. 5 illustrates a process 200 for patterning a TFT using a layer of the TFT as an etching mask to protect the GI. FIGS. 6-8 illustrate embodiments of a progression of TFT manufacturing using the process of FIG. 5.

First, similar to the process 50 of FIG. 2, a TFT backplane is prepared (block 202). After the display panel TFT backplane (e.g., a substrate) is prepared, a gate layer and gate insulator may be formed (block 204) on the backplane. For example, as discussed above, a gate metal may be deposited to form gate lines.

For example, an active layer that is to be deposited in the TFT may act as an etch stop around an aperture area (e.g., the transparent area excluding a pixel's wring and transistor areas) of the gate insulator. The active layer may be deposited over the gate insulator and patterned to create an etching mask over the aperture area (block 206). The active area may act as an electricity transfer mechanism between a source/drain coupled to the active layer. Because the active layer is patterned as an etching mask, the etch stop layer may be patterned (block 208). The etching mask portion of the active layer may protect the gate insulator from inadvertent etching in aperture area caused by patterning (e.g., dry etching) the etch stop layer Once patterning of the etch stop layer is complete, the remaining layers/components of the TFT may be deposited (block 210). For example, in some embodiments, the etching mask portion of the active layer may be removed and a source, drain, organic passivation layer, common electrode, a second passivation layer, and a pixel electrode layer may be deposited and patterned.

FIGS. 6A-6E illustrate an embodiment of a TFT 300 manufactured according to the process 200 of FIG. 5. First, in FIG. 6A, the substrate 102 is prepared for deposition of material. Further, the gates 104 are deposited and patterned (e.g., via a photolithographic process using a first mask) and a gate insulator 106 is deposited over the gates 104 (according to block 204 of FIG. 5). An active layer 108 is deposited over the gate insulator 106. Additionally, a PRL 302 defined by a second mask is used to pattern the active layer 108, such that a portion of the active layer 108 may remain over the aperture area 304 of the TFT 300.

Figure 6A:
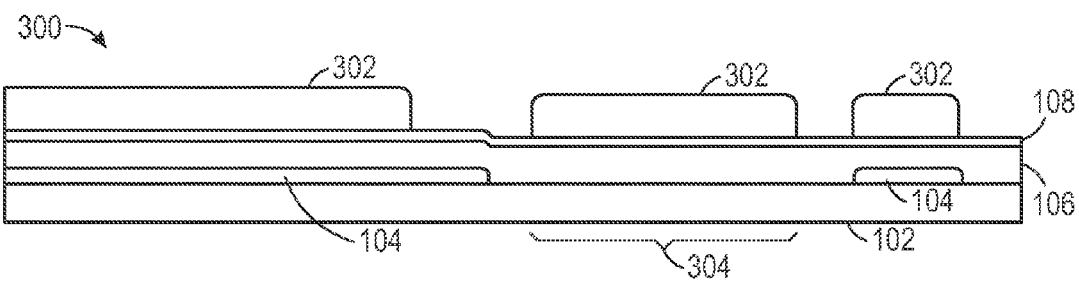
FIGS. 6A-6E illustrate a progression of manufacturing a TFT, using the process of FIG. 5, via eight masks, in accordance with an embodiment.
Figure 6B:
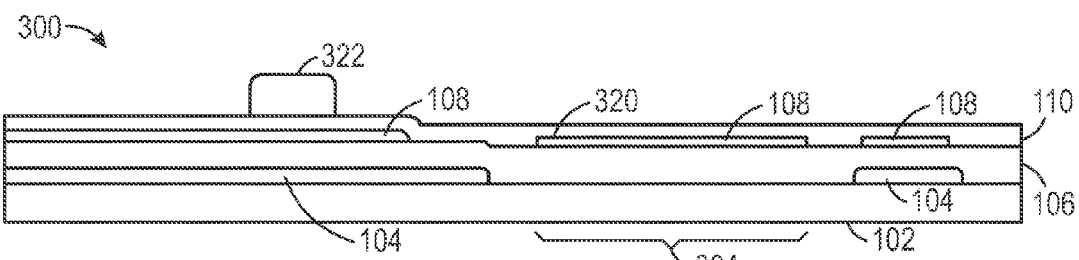
Figure 6C:
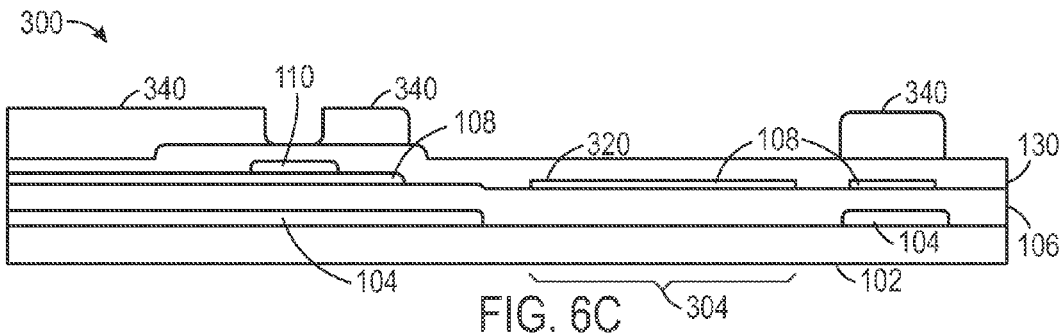
Figure 6D:
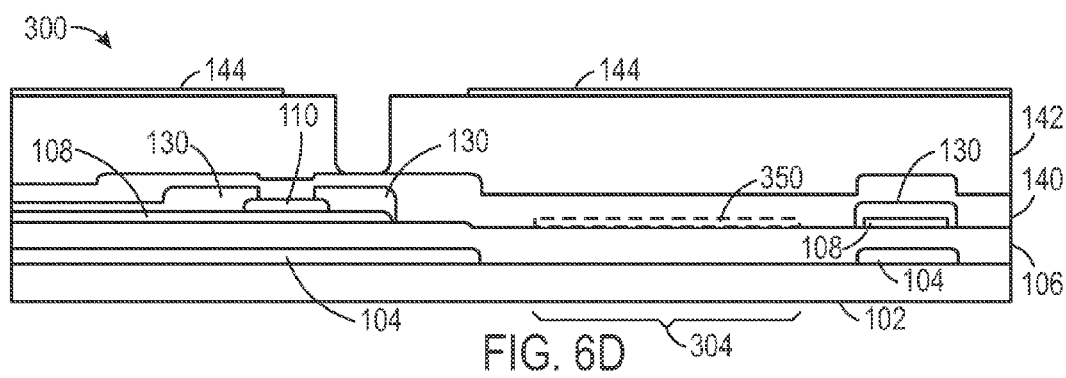
Figure 6E:
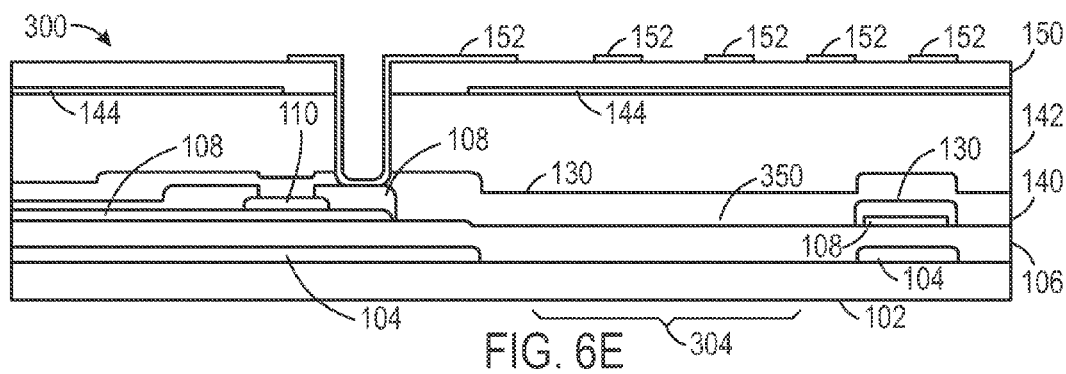

For example, in FIG. 6B, an etching mask 320 formed from the active layer 108 is retained over the aperture area 304. This etching mask 320 may be useful to protect the gate insulator 106 from etching during the etching of the etch stop layer 110 and/or other layers of the TFT 300. Next, a PRL 322 defined by a third mask is used to etch the etch stop layer 110. In FIG. 6C, a source and drain layer 130 is deposited over the etch stop layer 110, the active layer 108, and the gate insulator 106. The source and drain layer 130 is patterned using a fourth mask 340. In FIG. 6D, after the source and drain layer 130 is patterned, the active layer 108 making up the etching mask 320 may be removed (e.g., via etching the active area 108 over the aperture area 304) as illustrated by the dotted line 350. Further, a source and drain passivation layer 140 is deposited and an organic passivation layer 142 is deposited and patterned using a fifth mask. Additionally, a common electrode (VCOM) layer 144 is deposited and patterned using a sixth mask. In FIG. 6E, a second passivation layer 150 is deposited and patterned over the VCOM layer 144 using a seventh mask. Additionally, a pixel electrode layer 152 is formed over the second passivation layer 150 using a seventh mask, completing the TFT 300.

In an alternative embodiment depicted in FIGS. 7A-7F, seven masks may be used to manufacture the TFT 300. First, in FIG. 7A, the substrate 102 is prepared for deposition of material. Further, the gates 104 are deposited and patterned (e.g., via a photolithographic process using a first mask) and a gate insulator 106 is deposited over the gates 104 (according to block 204 of FIG. 5). An indium-tin-oxide (ITO) layer 360 is deposited and patterned (e.g., via a PRL 362 defined by a second mask) such that a portion of the ITO layer 360 is retained above the aperture area 304 of the TFT 300. This portion may be used as an etching mask 364.

Figure 7A:
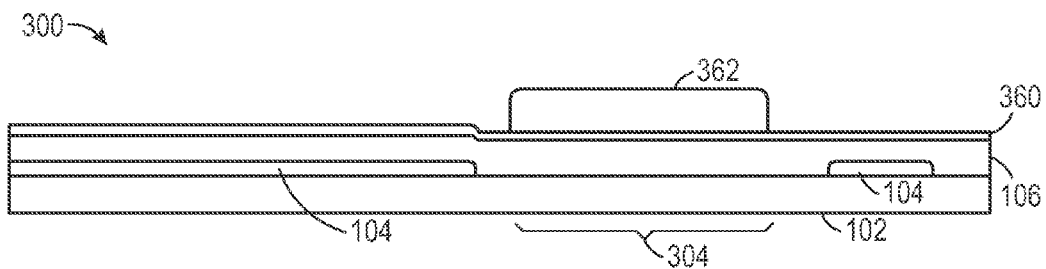
FIGS. 7A-7F illustrate a progression of manufacturing a TFT, using the process of FIG. 5, via seven masks, in accordance with an embodiment.
Figure 7B:
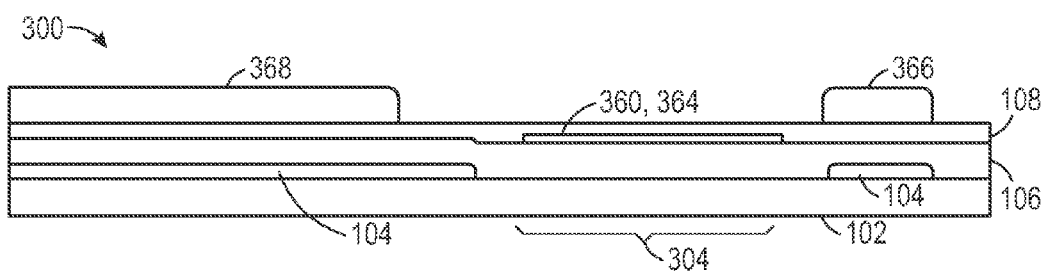
Figure 7C:
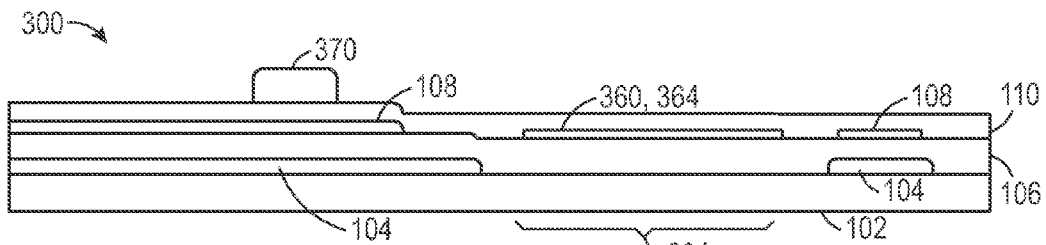
Figure 7D:
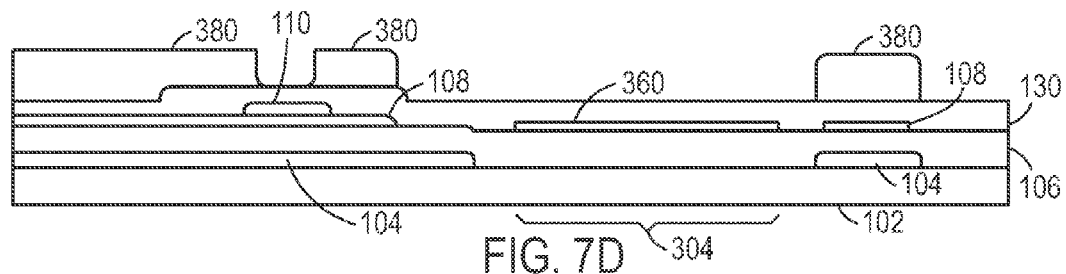

In FIG. 7B, an active layer 108 is deposited over the gate insulator 106 and the etching mask 364. A PRL 366, defined by a third mask, is used to pattern the active layer 108, such that a portion of the active layer 108 may remain over the gates 104. For example, in FIG. 7C, only the portion of the active layer 108 defined by the PRL 366 is retained. Next, the etch stop layer 110 is deposited, and a PRL 370, defined by a fourth mask, is used to etch the etch stop layer 110. The active layer 108 and the etching mask 364 may protect the gate insulator 106 from etching. In FIG. 7D, only the portion of the etch stop layer 110 defined by the mask 364 of FIG. 7C is retained. Further, a source and drain layer 130 is deposited over the etch stop layer 110, the active layer 108, the gate insulator 106, and the etching mask 364. The source and drain layer 130 is patterned using a PRL 380 defined by a fifth mask.

Figure 7E:
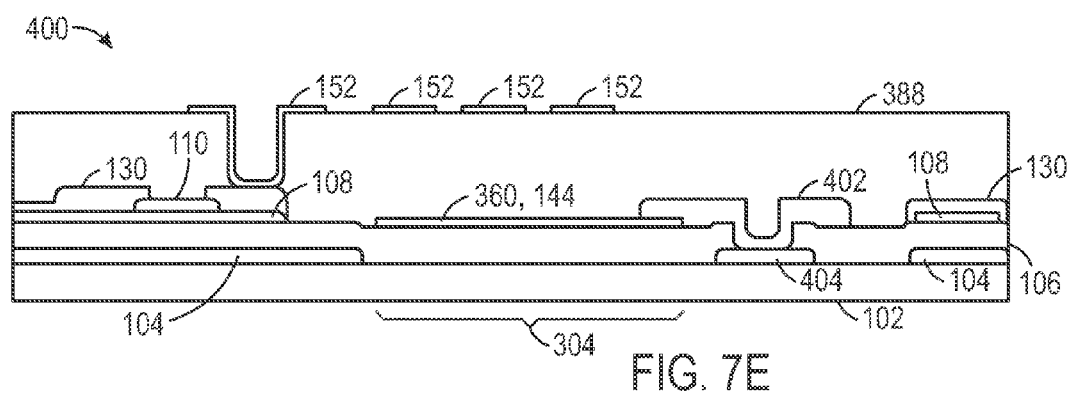
Figure 7F:
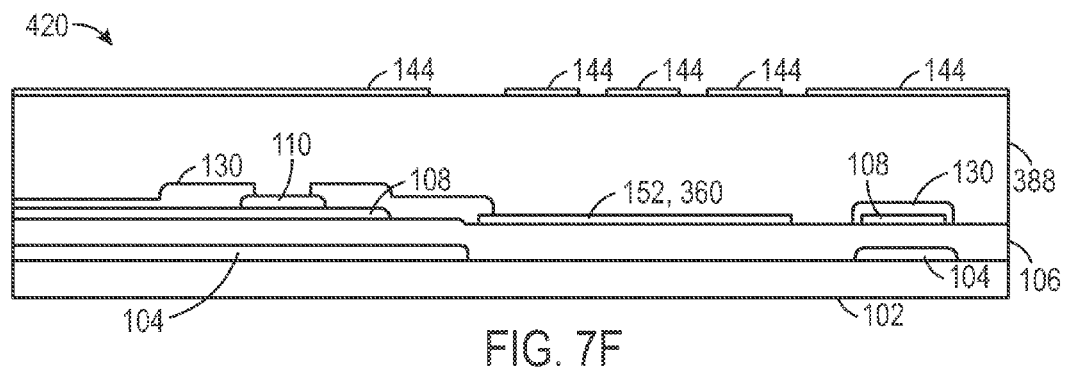

Because the etching mask 364 consists of ITO, it may be used as a common electrode or the pixel electrode for the TFT 300. FIG. 7E provides an embodiment of a top pixel electrode TFT 400 and FIG. 7F illustrates an embodiment of a top common electrode TFT 420. In FIG. 7E, after the source and drain layer 130 is patterned, a passivation layer 388 is deposited and patterned using a sixth mask. Additionally, a pixel electrode layer 152 is formed over the second passivation layer 150 using a seventh mask, completing the TFT 100. Further, the TFT 400 may include a conductive element 402 that electrically couples a common voltage source 404 with the ITO layer 360, enabling the ITO layer 360 to become the VCOM layer 144 of the TFT 400.

Alternatively, in FIG. 7F, the ITO layer 360 may become the pixel electrode layer 152 by being electrically coupled to the source and drain layer 130. In such embodiments, the ITO layer 360 is coupled to the source and drain layer 130, a passivation layer 388 is deposited and patterned using a sixth mask, and a VCOM layer 144 is deposited and patterned using a seventh mask, completing the TFT 420.

In some embodiments, six masks may be used to manufacture the TFT. FIGS. 8A-8E illustrate progressions of such a TFT 450. First, in FIG. 8A, the substrate 102 is prepared for deposition of material. Further, the gates 104 are deposited and patterned (e.g., via a photolithographic process using a first mask) and a gate insulator 106 is deposited over the gates 104 (according to block 204 of FIG. 5). An active layer 108 is deposited over the gate insulator 106. Additionally, a PRL 302, defined by a second mask, is used to pattern the active layer 108 such that a portion of the active layer 108 may remain over the aperture area 304 of the TFT 450.

Figure 8A:
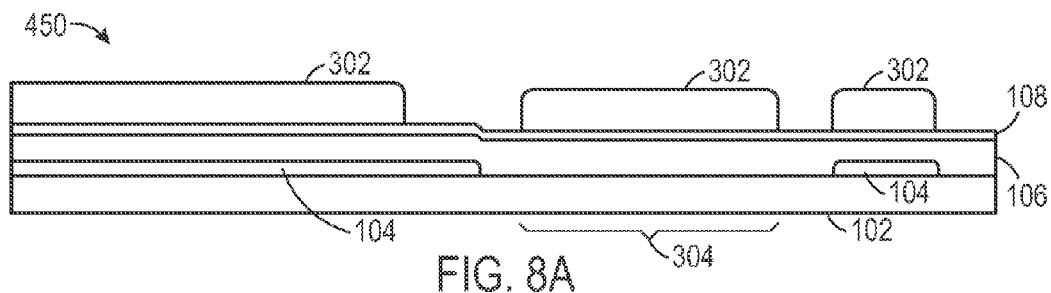
FIGS. 8A-8E illustrate a progression of manufacturing a TFT, using the process of FIG. 5, via six masks, in accordance with an embodiment.
Figure 8B:
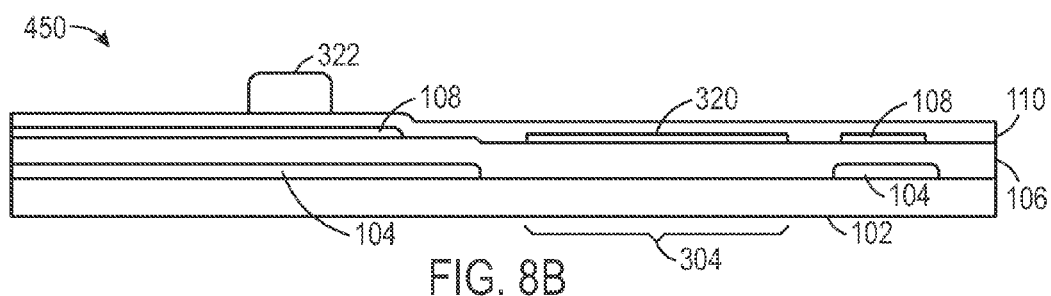
Figure 8C:
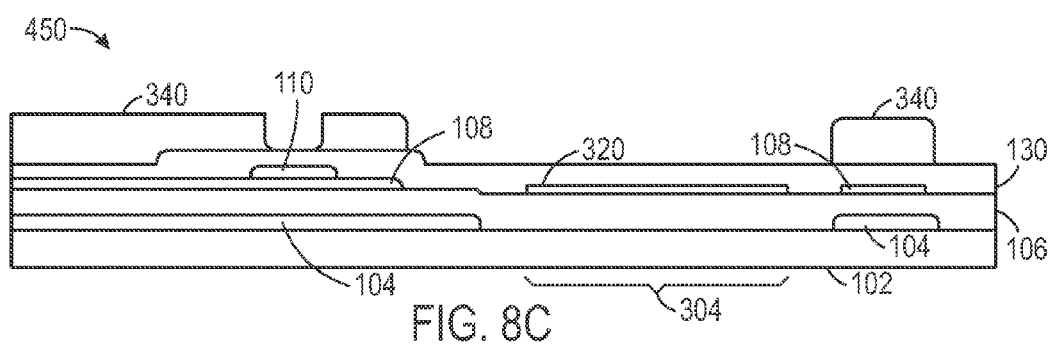

For example, in FIG. 8B, an etching mask 320 formed from the active layer 108 is retained over the aperture area 304. This etching mask 320 may be useful to protect the gate insulator 106 from etching during the etching of the etch stop layer 110 and/or other layers of the TFT 300. Next, a PRL 322, defined by a third mask, is used to etch the etch stop layer 110. In FIG. 8C, a source and drain layer 130 is deposited over the etch stop layer 110, the active layer 108, and the gate insulator 106. The source and drain layer 130 is patterned using a PRL 340 defined by a fourth mask.

As above, with regards to embodiments of FIGS. 7E and 7F, the active layer may be used as a VCOM layer 144 or a pixel electrode layer 152. To do this, the etching mask portion 320 of the active layer 108 may be conductively charged. This may be done, in example, by hydrogen doping through a chemical vapor deposition (CVD) process, hydrogen doping though an additional hydrogen or NH3 plasma treatment, or by increasing conductivity through an argon plasma treatment.

Figure 8D:
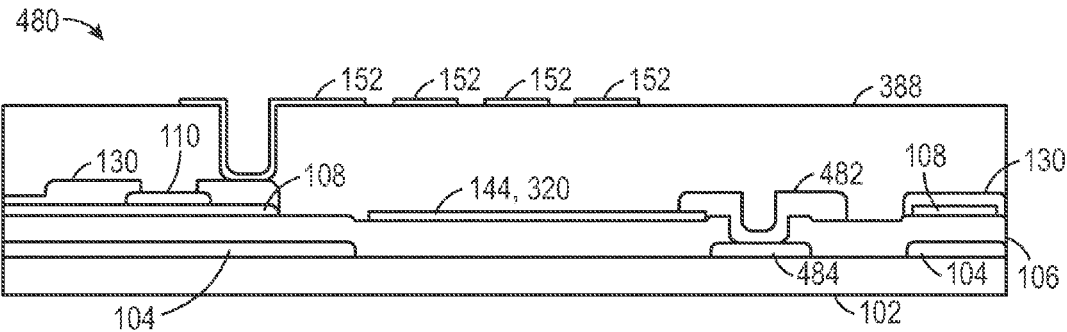
Figure 8E:
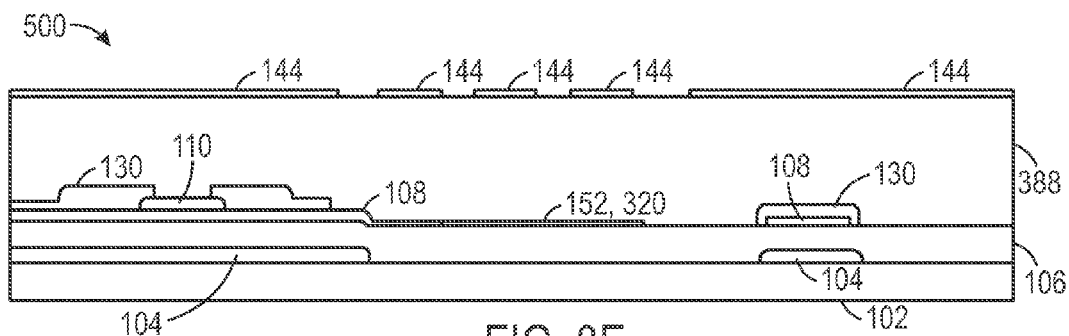

FIGS. 8D and 8E make use of the conductive etching mask 320. FIG. 8D provides an embodiment of a top pixel electrode TFT 400 and FIG. 8E illustrates an embodiment of a top common electrode TFT 500. In FIG. 8D, after the source and drain layer 130 is patterned, a passivation layer 388 is deposited and patterned using a fifth mask. Additionally, a pixel electrode layer 152 is formed over the passivation layer 388 using a sixth mask, completing the TFT 100. Further, the TFT 480 may include a conductive element 482 that electrically couples a common voltage source 484 with the active layer 320, enabling the active layer 320 to become the VCOM layer 144 of the TFT 450.

Alternatively, in FIG. 8E, the active layer 320 may become the pixel electrode layer 152 by being electrically coupled to the source and drain layer 130. In such embodiments, the active layer 320 is coupled to the source and drain layer 130, a passivation layer 388 is deposited and patterned using a fifth mask, and a VCOM layer 144 is deposited and patterned using a sixth mask, completing the TFT 500.

Figure 9:
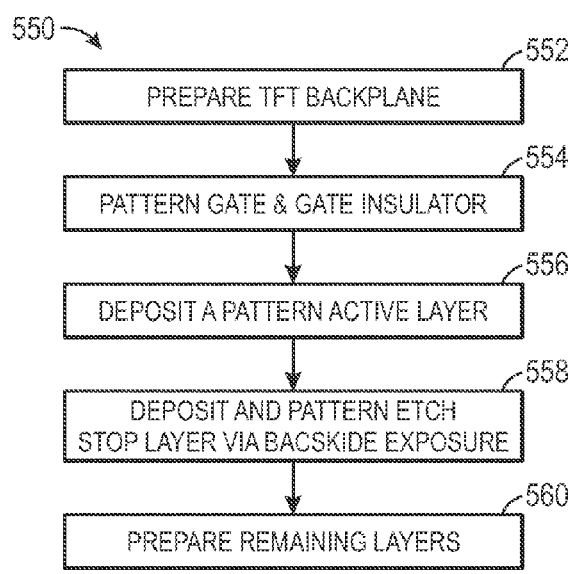
FIG. 9 is a flowchart describing a process for manufacturing a uniform gate insulator using a backside exposure, in accordance with an embodiment.

In some embodiments, the TFTs may be patterned using self-alignment process. FIG. 9 is a flowchart depicting such a process 550. The process 550 begins by preparing a TFT backplane (block 552). After the display panel TFT backplane (e.g., a substrate) is prepared, a gate layer and gate insulator may be formed on the backplane (block 554). The active layer may be deposited over the gate insulator and patterned to create an etching mask over the aperture area (block 556). An etch stop layer may be deposited and patterned via a backside exposure (block 558). For example, light may be exposed through the substrate to develop an etching mask useful for etching the etch stop. Because the active layer is patterned as an etching mask, patterning the etch stop layer will not affect the gate insulator near the aperture area. The etching mask portion of the active layer may protect the gate insulator from inadvertent etching in aperture area caused by patterning (e.g., dry etching) the etch stop layer Once patterning of the etch stop layer is complete, the remaining layers/components of the TFT may be deposited (block 560). For example, in some embodiments, a source, drain, organic passivation layer, common electrode, a second passivation layer, and a pixel electrode layer 152 may be deposited and patterned. The source may be coupled to data lines that may be used to transmit image data from a source driver of the display panel TFT backplane to pixels of the display panel TFT backplane corresponding to the data lines. A source/drain passivation layer may be disposed over the source/drain and may insulate the source/drain from outer layers of the display panel TFT backplane.

FIGS. 10A-10D illustrate a progression of manufacture of a TFT 570 using the process 550 of FIG. 9. First, in FIG. 10A, the substrate 102 is prepared for deposition of material. Further, the gates 104 are deposited and patterned (e.g., via a photolithographic process using a first mask) and a gate insulator 106 is deposited over the gates 104 (according to block 552 of FIG. 9). Further an active layer 108 is deposited and patterned by a PRL 572 defined by a second mask. The patterned active layer 108 may include a portion 574 over and aperture area 304 of the TFT 570, which may be used to protect the gate insulator 106 from a future etching process.

Figure 10A:
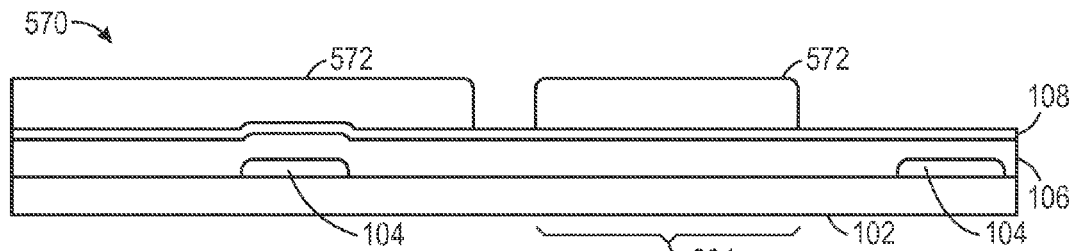
FIGS. 10A-10D illustrate a progression of manufacturing a TFT, using the process of FIG. 9, via five masks, in accordance with an embodiment.
Figure 10B:
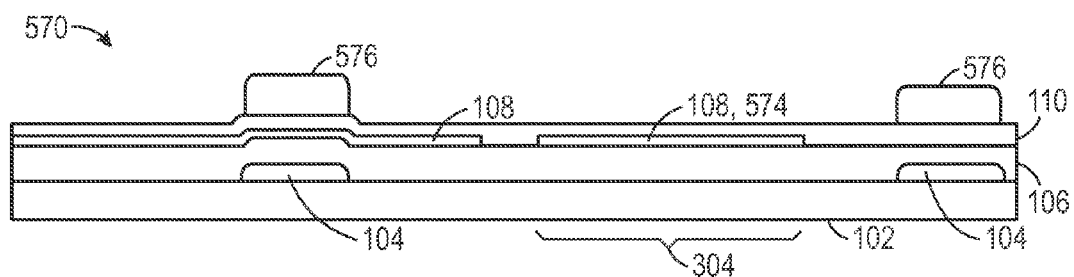

In FIG. 10B, an etch stop layer 110 is deposited over the active layer 108 and the gate insulator 106. A PRL 576 may be created by exposing a photo-sensitive material to light sources from the backside of the TFT 570. For example, the gates 104 may be used to mask and develop the photo-sensitive material, causing the portions above the gates 104 to remain, while other portions of the photo-sensitive material are removed. Accordingly, the PRL 576 is formed. The etch stop layer 110 may be patterned using a dry etch defined by the PRL 576. The gate insulator 106 near the aperture area 304 will not be harmed by this etching because the portion 574 of the active layer 108 protects the gate insulator 106.

Figure 10C:
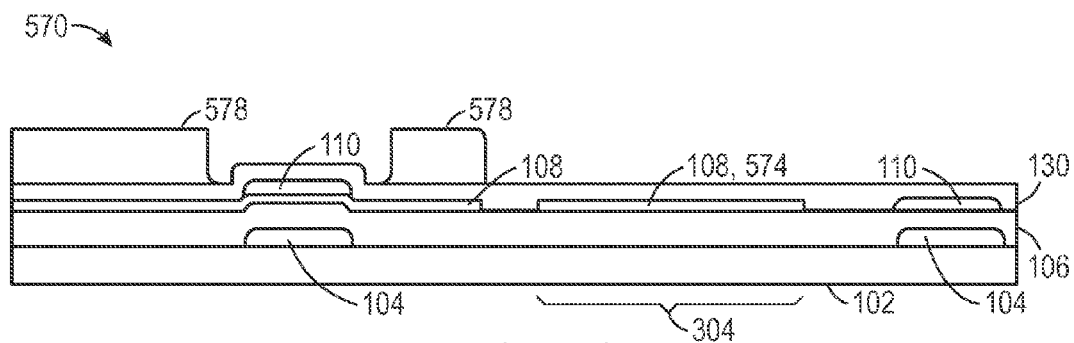
Figure 10D:
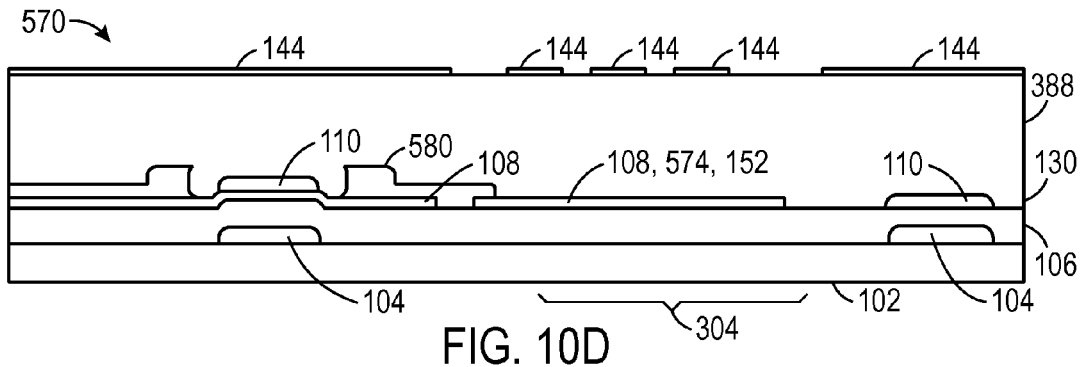

In FIG. 10C, the source and drain layer 130 is deposited and patterned using a PRL 578 defined by a third mask. Accordingly, in FIG. 10D, only the portions of the source and drain layer 130 defined by the PRL 578 of FIG. 10C are retained. As illustrated in FIG. 10D, portion 574 may be electrically coupled to the source and drain layer 130 via a conductive element 580. The portion 574 may be made conductive through hydrogen doping though a CVD process, by an additional hydrogen or NH3 plasma treatment, or through increased conductivity created by an argon plasma treatment. The conductive portion 574 may now be used as a pixel electrode layer 152. Further, a passivation layer 388 is deposited and patterned using a fourth mask and a common electrode layer 144 is deposited and patterned using a fifth mask, completing the TFT 570.

In some embodiments, two or more of the above described embodiments may be combined. For example, FIGS. 11A-11E illustrate a progression of a TFT 600 manufactured using a combination of the techniques described in FIGS. 10A-10D and FIGS. 7A-7E. Further, FIGS. 12A-12D illustrate a progression of a TFT 650 manufactured using a combination of the techniques described in FIGS. 4A-4D and FIGS. 7A-7F. Additionally, 13A-13D illustrate a progression of a TFT 700 manufactured using a combination of the techniques described in FIGS. 4A-4D and FIGS. 8A-8E.

Figure 11A:
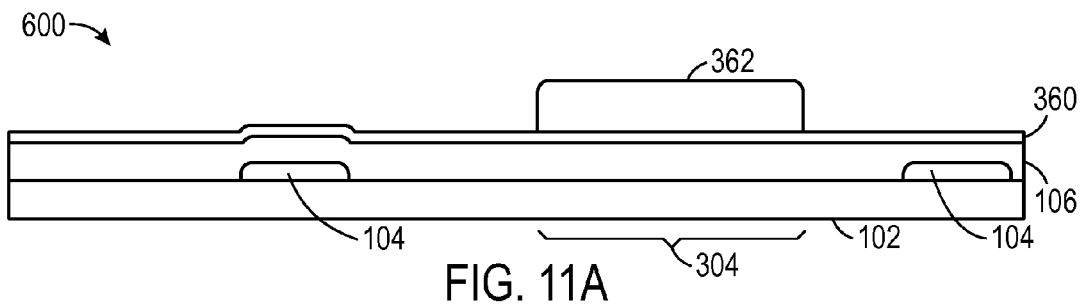
FIGS. 11A-11E illustrate a progression of manufacturing a TFT, using a combination of the processes described in FIGS. 7 and 10, in accordance with an embodiment.

In FIG. 11A, similar to FIG. 7A, the substrate 102 is prepared for deposition of material. Further, the gates 104 are deposited and patterned (e.g., via a photolithographic process using a first mask) and a gate insulator 106 is deposited over the gates 104 (according to block 204 of FIG. 5). An indium-tin-oxide (ITO) layer 360 is deposited and patterned (e.g., via a PRL 362 defined by a second mask) such that a portion of the ITO layer 360 is retained above the aperture area 304 of the TFT 300, which may be used as an etching mask 364.

Figure 11B:
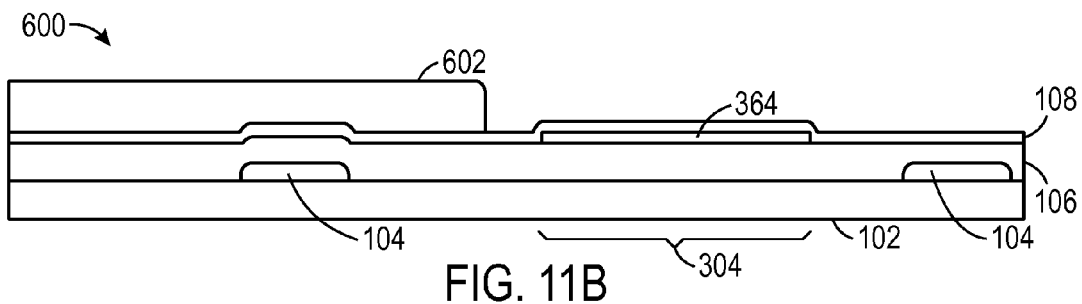
Figure 11C:
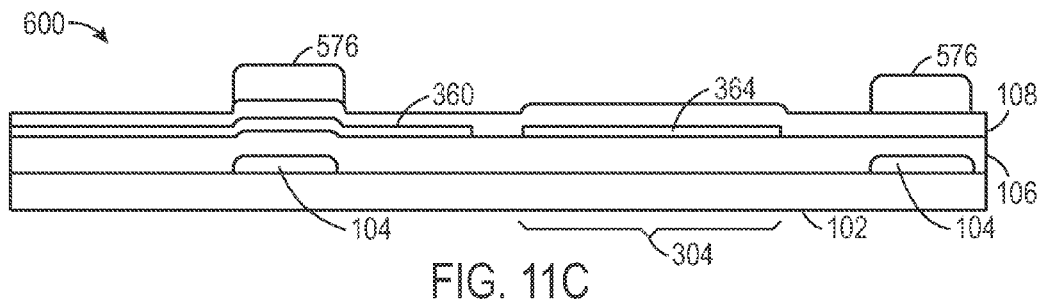

In FIG. 11B, similar to FIG. 10A, an active layer 108 is deposited over the gate insulator 106 and the etching mask 364. A PRL 366, defined by a third mask, is used to pattern the active layer 108, such that a portion of the active layer 108 may remain over the gates 104. In FIG. 11C, similar to FIG. 10B, an etch stop layer 110 is deposited over the active layer 108 and the gate insulator 106. A PRL 576 may be created by exposing a photo-sensitive material to light sources from the backside of the TFT 570. For example, the gates 104 may be used to mask and develop the photo-sensitive material, causing the portions above the gates 104 to remain, while other portions of the photo-sensitive material are removed. Accordingly, the PRL 576 is formed. The etch stop layer 110 may be patterned using a dry etch defined by the PRL 576. The gate insulator 106 near the aperture area 304 will not be harmed by this etching because the etching mask 364 of the active layer 108 protects the gate insulator 106.

Figure 11D:
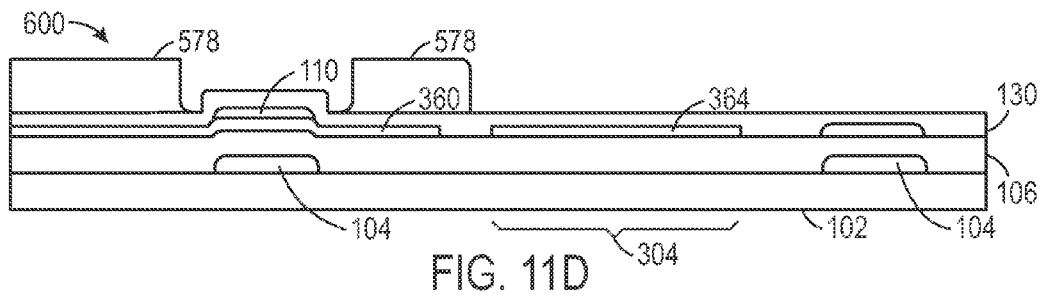
Figure 11E:
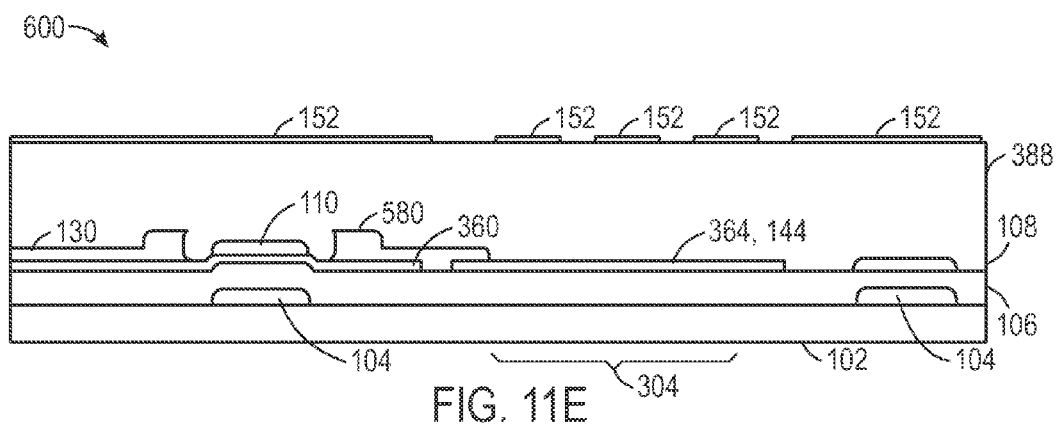

In FIG. 11D, the source and drain layer 130 is deposited and patterned using a PRL 578 defined by a fourth mask. Accordingly, in FIG. 11E, only the portions of the source drain layer 130 defined by the PRL 578 of FIG. 11D are retained. As illustrated in FIG. 11E, the etching mask 364 may be electrically coupled to the source and drain layer 130 via a conductive element 580, creating VCOM layer 144. The passivation layer 388 is deposited and patterned using a fifth mask. Further, the pixel electrode layer 152 may be deposited and patterned using a sixth mask, completing the TFT 600.

In the TFT 650 depicted in FIGS. 12A-12D, the gates 104 and gate insulator 106 are deposited and patterned on the substrate 102 using a first mask. An ITO layer 360 is deposited and patterned using a second mask, such that a portion of the ITO layer 360 is retained over the aperture area 304, creating an etching mask 364. An etch stop layer 110 is deposited and patterned using a PRL 652, defined by a third mask, leaving only a portion of the etch stop layer 110 over the gate 104.

Figure 12A:
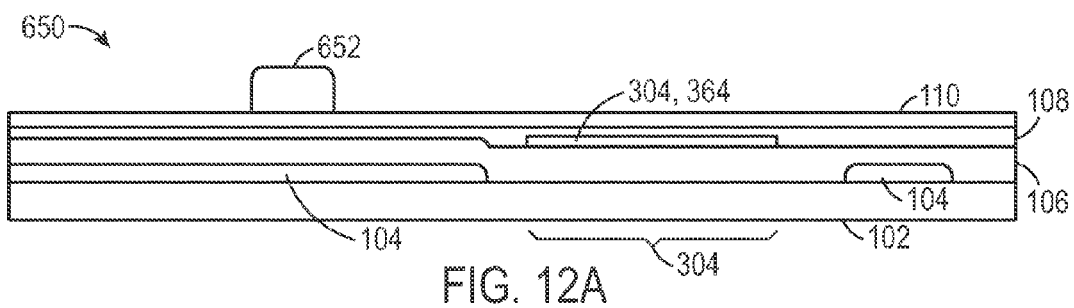
FIGS. 12A-12D illustrate a progression of manufacturing a TFT, using a combination of the processes described in FIGS. 4 and 7, in accordance with an embodiment.
Figure 12B:
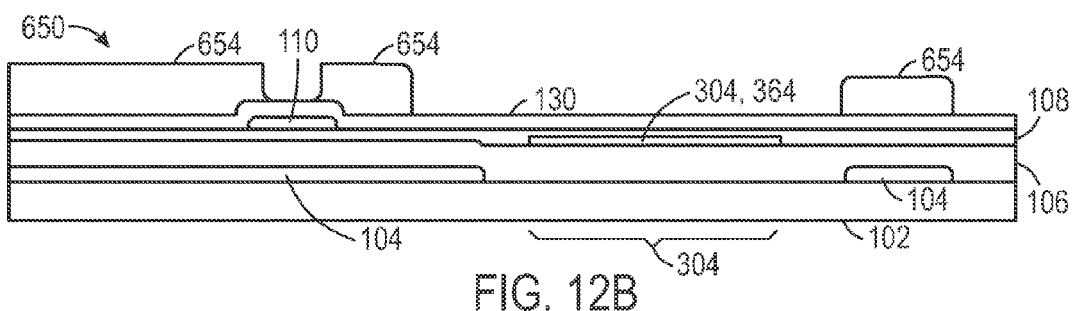
Figure 12C:
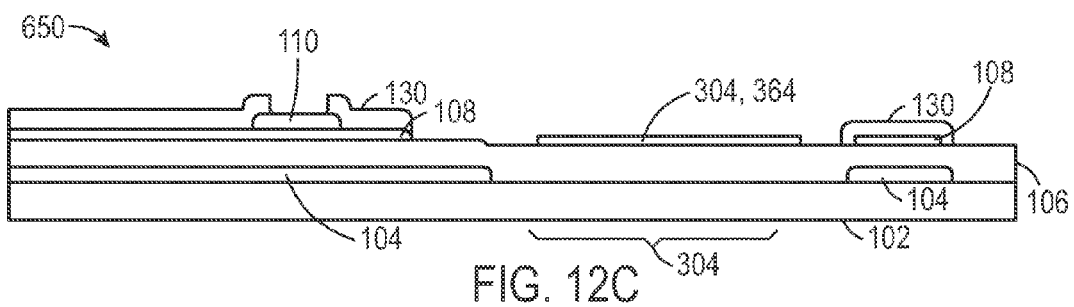
Figure 12D:
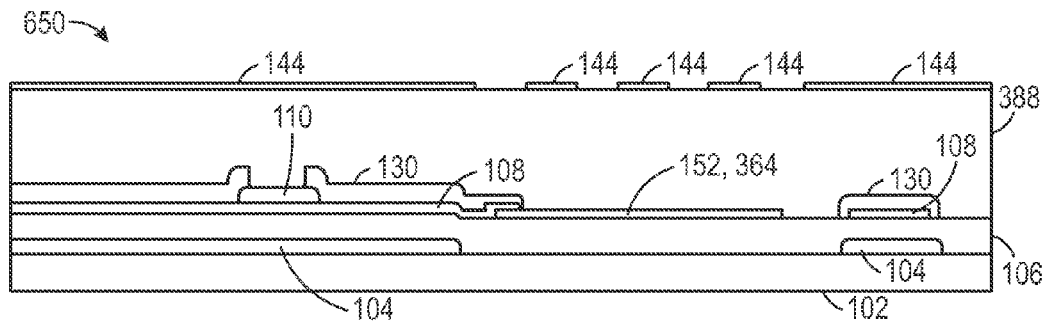

As illustrated in FIG. 12B, a source and drain layer 130 may be deposited over the active layer 108 and the etch stop layer 110. A PRL 654, defined by a fourth mask, is used to pattern the source and drain layer 130 and the active layer 108. Accordingly, in FIG. 12C, only the portions of the source and drain layer 130 and the active layer 108 defined by the mask 654 are retained. A photo resist ashing process and a secondary source and drain layer 130 etching may occur. In FIG. 12D, the etching mask 364 is electrically coupled to the active layer 108, creating a pixel electrode layer 152. A passivation layer 388 is deposited and patterned using a fifth mask. Further, a common electrode layer 144 is deposited and patterned using a sixth mask, thus completing the TFT 650.

In the TFT 700 depicted in FIGS. 13A-13D, the gates 104 and the gate insulator 106 are deposited and patterned on the substrate 102 using a first mask. An active layer 108 is deposited over the gate insulator 106 and an etch stop layer 110 is deposited over the active layer 108. A PRL 702, defined by a second mask, is used to pattern the etch stop layer 100.

Figure 13A:
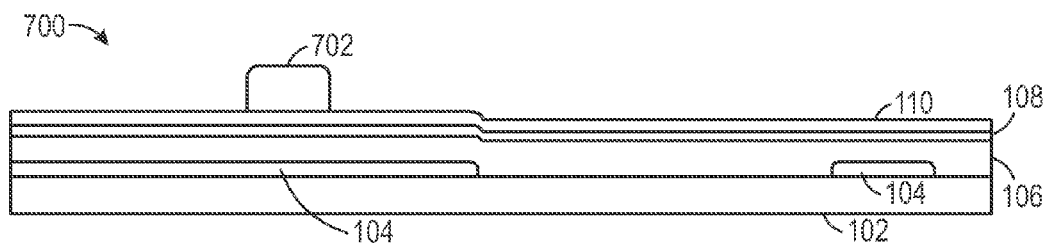
FIGS. 13A-13D illustrate a progression of manufacturing a TFT, using a combination of the processes described in FIGS. 4 and 8, in accordance with an embodiment.
Figure 13B:
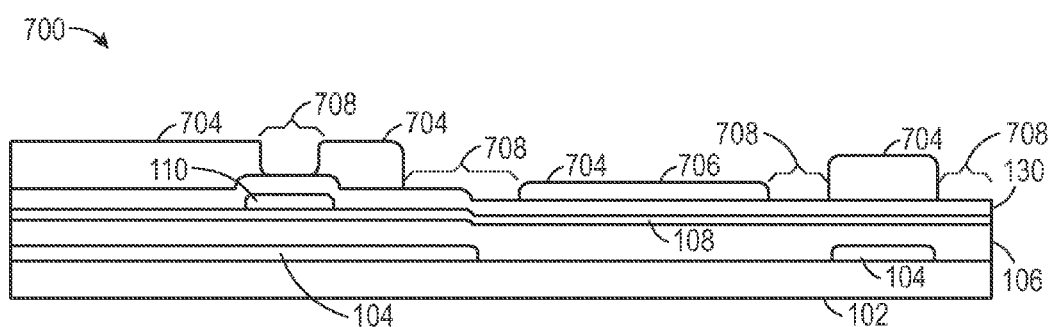

In FIG. 13B, a source and drain layer 130 is deposited over the patterned etch stop layer 110 and a PRL 704 with halftone 706 is created with a first mask. The PRL 704 may be useful in pattering the source and drain layer 130. Further, as will be seen, the halftone 706 may be useful in retaining a portion of the active layer 108, without an additional mask. Portions of the source and drain layer 130 are removed, as defined by the PRL 704. For example, portions 708 of the source and drain layer 130 will be removed.

Figure 13C:
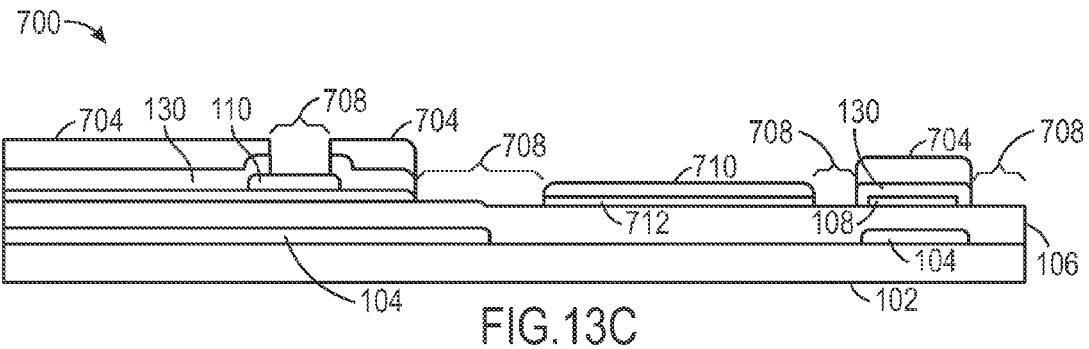

In FIG. 13C, a photo resist ashing process is applied, causing the mask 704 to be reduced approximately by one-half. Accordingly, the halftone 706 is removed. An additional source and drain layer 130 patterning (e.g., etching) is completed, causing the portion 710 previously under the halftone 706 to be removed. The portion 712 of the active layer 108 may protect the gate insulator 106 against inadvertent etching near the aperture area 304 of the TFT 700.

Figure 13D:
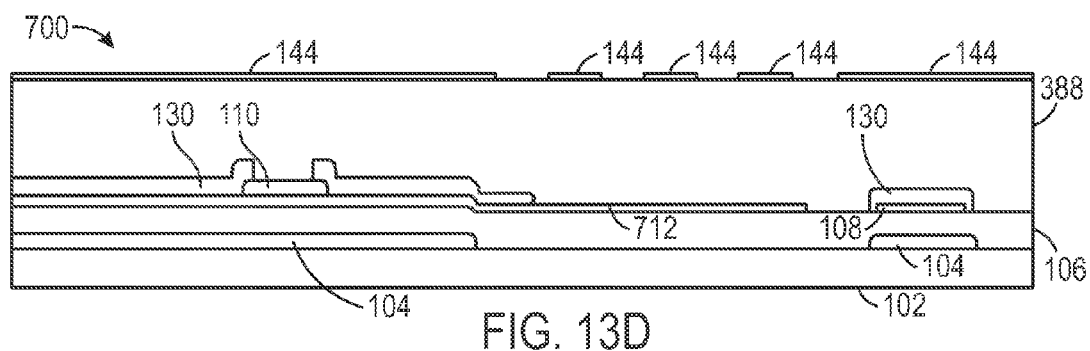

In FIG. 13D, the portion 712 is electrically coupled to the source and drain layer 130. The conductivity of portion 712 is increased. For example, the conductivity may be increased by hydrogen doping via a CVD process, hydrogen doping through additional hydrogen or NH3 plasma treatment, or by increasing the conductivity through an argon plasma treatment. The increased conductivity of the portion 712 may enable the portion 712 to act as a pixel electrode layer 152. Next, a passivation layer 133 is deposited and patterned using a fourth mask. Finally, the TFT 700 is completed by depositing and patterning a VCOM electrode layer 144 using a fifth mask.

As may be appreciated, by implementing the techniques described herein, manufacturing accuracy of the display panel TFTs may increase. For example, the uniformity of the gate insulator of the TFTs may be increased by adding an addition etching protection layer prior to an etching procedure that may inadvertently remove a portion of the gate insulator. The increased uniformity may provide a more stable image quality, reducing mura effects and other artifacts that may stem from non-uniform gate insulators.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method, comprising:
patterning a gate and gate insulator on a thin-film-transistor (TFT) backplane;
depositing and patterning a masking layer to create an etching mask over an aperture area of the TFT backplane;
depositing and patterning an etch-stop layer, wherein the etching mask shields the gate insulator from etching at the aperture area; and
removing the etching mask after etching the aperture area.

2. The method of claim 1, comprising:
wherein depositing and patterning the masking layer to create an etching mask over the aperture area comprises patterning the masking layer to create an active layer over an active area;
depositing the etch-stop layer after depositing and patterning the active area.

3. The method of claim 2, comprising:
depositing and patterning a source and drain layer after pattering the etch-stop layer;
depositing and patterning an organic passivation layer over the source and drain layer, the etch-stop layer, and the gate insulator;
depositing and patterning a common electrode (VCOM) layer over the patterned organic passivation layer;
depositing and patterning a second passivation layer over the patterned VCOM layer; and
depositing and patterning a pixel electrode layer over the patterned second passivation layer.

4. The method of claim 2, comprising:
depositing and patterning a source and drain layer after pattering the etch-stop layer;
increasing the conductivity of the etching mask; and
depositing and patterning a passivation layer over the source and drain layer, the etch-stop layer, the etching mask, and the gate insulator.

5. The method of claim 4, comprising:
electrically coupling the etching mask to a common electrode source to use the etching mask as a common electrode layer; and
depositing and patterning a pixel electrode layer over the patterned passivation layer.

6. The method of claim 4, comprising:
electrically coupling the etching mask to the source and drain layer to use the etching mask as a pixel electrode layer; and
depositing and patterning a common electrode layer over the patterned passivation layer.

7. A method, comprising:
patterning a gate and gate insulator on a thin-film-transistor (TFT) backplane;
depositing and patterning a masking layer to create an etching mask over an aperture area of the TFT backplane;
depositing and patterning an etch-stop layer, wherein the etching mask shields the gate insulator from etching at the aperture area;
wherein depositing and patterning the masking layer comprises depositing and patterning an indium tin oxide (ITO) layer;
depositing and patterning an active layer over the patterned ITO layer; and
depositing the etch-stop layer over the patterned active layer.

8. The method of claim 7, comprising:
depositing and patterning a source and drain layer over the patterned active layer, the patterned etch-stop layer, the gate insulator, and the patterned ITO layer; and
depositing and patterning a passivation layer over the patterned source and drain layer, the patterned etch-stop layer, the etching mask and the gate insulator.

9. The method of claim 8, comprising:
electrically coupling the etching mask to a common electrode source to use the etching mask as a common electrode; and
depositing and patterning a pixel electrode layer over the patterned passivation layer.

10. The method of claim 8, comprising:
electrically coupling the etching mask to the source and drain layer to use the etching mask as a pixel electrode layer; and
depositing and patterning a common electrode layer over the patterned passivation layer.

11. A method, comprising:
patterning a gate and gate insulator on a thin-film-transistor (TFT) backplane;
depositing and patterning a masking layer to create an etching mask over an aperture area of the TFT backplane;
depositing and patterning an etch-stop layer, wherein the etching mask shields the gate insulator from etching at the aperture area;
wherein depositing and patterning the masking layer to create an etching mask over the aperture area comprises patterning the masking layer to create an active layer over an active area; and
increasing the conductivity of the etching mask.

12. The method of claim 11, comprising:
electrically coupling the etching mask to the source and drain layer to use the etching mask as a pixel electrode layer.

* * * * *